US006768292B2

(12) United States Patent
Hapke

(10) Patent No.: US 6,768,292 B2
(45) Date of Patent: Jul. 27, 2004

(54) ARRANGEMENT AND METHOD HAVING A DATA WORD GENERATOR FOR TESTING INTEGRATED CIRCUITS

(75) Inventor: Friedrich Hapke, Winsen/Luhe (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/090,348

(22) Filed: Mar. 4, 2002

(65) Prior Publication Data

US 2002/0144202 A1 Oct. 3, 2002

(30) Foreign Application Priority Data

Mar. 7, 2001 (DE) .......................................... 101 10 777

(51) Int. Cl.[7] .......................... G01R 31/02; G01R 1/04
(52) U.S. Cl. ................................ 324/73.1; 324/158.1
(58) Field of Search ............................. 324/73.1, 763, 324/765, 158.1, 103 R; 714/724–726, 736–738

(56) References Cited

U.S. PATENT DOCUMENTS

| 4,710,704 A | * | 12/1987 | Ando | .................. 324/103 R |
| 5,285,153 A | * | 2/1994 | Ahanin et al. | .............. 324/73.1 |
| 5,355,081 A | * | 10/1994 | Nakata et al. | .............. 324/765 |
| 5,488,612 A | * | 1/1996 | Heybruck | ................... 714/725 |
| 5,614,818 A | * | 3/1997 | El Ayat et al. | ............. 324/73.1 |
| 5,617,531 A | * | 4/1997 | Crouch et al. | .............. 714/744 |
| 6,057,679 A | * | 5/2000 | Slizynski et al. | ........ 324/158.1 |
| 6,411,124 B2 | * | 6/2002 | Lee et al. | ..................... 326/41 |

FOREIGN PATENT DOCUMENTS

| EP | 164209 A1 | * | 12/1985 | ................. 714/726 |
| JP | 2002333466 A | * | 3/2002 | ....... G01R/31/3183 |

* cited by examiner

Primary Examiner—Kamand Cuneo
Assistant Examiner—Jermele Hollington
(74) Attorney, Agent, or Firm—Michael J. Ure

(57) ABSTRACT

The invention relates to an arrangement for testing an integrated circuit (1; 21). In order in this case to avoid a test vector memory and an on-board test system, a data word generator (2; 22), which supplies deterministic data words, means (3, 4, 5, 6; 22, 23, 24, 25, 26, 27) for test pattern generation, which modify the deterministic data words such that prescribed test patterns are produced which can be fed to inputs of an integrated circuit (1; 21) to be tested, and comparison means (12; 30) for comparing test output patterns of the integrated circuit (1; 21) with desired output patterns.

10 Claims, 2 Drawing Sheets

ARRANGEMENT AND METHOD HAVING A DATA WORD GENERATOR FOR TESTING INTEGRATED CIRCUITS

FIELD OF THE INVENTION

The invention relates to an arrangement and a method for testing integrated circuits.

BACKGROUND OF THE INVENTION

Integrated circuits are tested after being produced; they are generally fed for this purpose what are termed test vectors, which are data words that are fed to the inputs of the integrated circuit, and which produce at the outputs a specific response of the integrated circuit which is compared with a desired response. It can be established thereby whether the integrated circuit is working acceptably, that is to say has been correctly produced.

Owing to the increasing integration density of such integrated circuits, the number of necessary test vectors is increasing more and more. In accordance with the prior art, these test vectors are stored in vector memories. In this context there maybe several million test vectors per pin of the integrated circuit to be tested. This high number leads to a very high outlay for such test systems, and this leads, in turn, to an increase in production costs of the integrated circuit to be tested.

Another solution known in the prior art is what is termed a built-in self test (BIST), in the case of which there is provided on the integrated circuit a special test circuit which cooperates with an external, simple test system. This, in turn, has the disadvantage that an additional need for surface area arises for the test circuit on the integrated circuit, and that, furthermore, the useful circuit present on the integrated circuit must be modified. This in turn involves the risk that this useful circuit cannot be optimally designed.

SUMMARY OF THE INVENTION

It is an object of the invention to specify an arrangement and a method for testing integrated circuits which do not require any special measures on an integrated circuit to be tested, and which are relatively simple in their design.

This object is achieved according to the invention by means of the features of patent claim 1:

An arrangement for testing an integrated circuit, having a data word generator, which supplies deterministic data words, having means for test pattern generation, which modify the deterministic data words such that prescribed test patterns which can be fed to inputs of an integrated circuit to be tested, are produced, and having comparison means for comparing test output patterns of the integrated circuit with desired output patterns, the arrangement being provided outside the integrated circuit to be tested.

A voluminous vector memory can be eliminated in the case of the arrangement according to the invention for testing an integrated circuit. Instead of this, a data word generator which supplies deterministic data words is provided. This means that the data word generator supplies a sequence of data words which are known, that is to say can be predicted.

These deterministic data words of the data word generator are modified in a bitwise fashion with the aid of means for test pattern generation. In this case, the individual bits of each of these deterministic data words are modified such that prescribed, deterministic data patterns are produced. These test patterns are provided for the purpose of being fed to the inputs of the integrated circuit to be tested, and/of representing the desired output pattern.

Desired output patterns are likewise generated by the modification. The output signals of the integrated circuit to be tested, which are produced by the test patterns, are compared with these desired output patterns with the aid of comparison means.

It is possible in this relatively simple way to perform a test pattern generation which does not require a test pattern memory in which all the test patterns and/or vectors are stored. However, it is rather possible to use the data word generator and the means of test pattern generation to generate sequentially a sequence of consecutive test patterns without the need for these to be individually present in a memory.

The arrangement is provided outside an integrated and does not require on the integrated circuit that is to be tested any special measures, that is to say, in particular, no modification of the circuitry to be tested on the circuit, and also no additional surface area requirement on the integrated circuit.

The arrangement according to the invention will generally cooperate with a simple test system which essentially undertakes to control the arrangement and, if appropriate, evaluate the comparison results.

In accordance with a refinement of the invention, according to claim 2 a feedback shift register is provided as data word generator. Such a feedback shift register supplies pseudo random data words which are, however, generated according to a fixed pattern and are therefore known, that is to say are deterministic. Consequently, it is possible in this way, which is very simple in terms of circuitry, to generate the deterministic data words for the means for test pattern generation.

In accordance with a further refinement of the invention as claimed in claim 3, the means for test pattern generation are advantageously divided into bit flipping controller and bit flipping logic circuits which are driven by the bit flipping controller. The bit flipping logic circuits are provided for the purpose of individually modifying the bits of each deterministic data word supplied by the data word generator such that the desired value is achieved on the output side for the respective bit, such that the bit flipping logic circuits as a whole supply on the output side a desired prescribed deterministic test pattern data word which is fed to the inputs of the integrated circuit to be tested.

In the integrated circuit, it is possible to provide, if appropriate, circuit elements which have an undefined or memory response. No evaluation of the output patterns of the integrated circuit is possible during testing in this case. Generally, what is involved in this case is specific output test patterns in specific testing phases which cannot, or should not, be evaluated. In order to solve this problems, in accordance with a further refinement of the invention as claimed in claim 4, a masking logic circuit is provided which controls the comparison means in the arrangement such that only prescribed test output patterns of the integrated circuit to be tested are compared with the desired patterns. In other words, this logic masks specific output patterns, this is to say output patterns which are not to be evaluated for the reasons explained above are suppressed with reference to the evaluation.

A further refinement of the invention as claimed in claim 5 includes a test pattern counter which counts a clock signal which controls the test operation and relays the corresponding counting result to elements of the arrangement, in particular to the bit flipping controller and/or the masking logic circuit. Since, on the basis of the design of the arrangement according to the invention, a clock signal suffices for generating the test patterns, it is quite easily possible in this way to establish, on the basis of the counting result of the counter, the test phase in which a test operation is located.

The comparison means possibly need not compare each individual data word per se with a desired pattern; this can also be done, as provided in accordance with a further refinement of the invention as claimed in claim 6, by means of a signature register. The signature register combines each new output data word of the integrated circuit to be tested with a previous memory result by exclusive-OR logic operation. This operation is repeated with each new test pattern. At the end of the test operation, the value of the signature register is read out and compared with a desired value.

As provided in accordance with a further refinement of the invention as claimed in claim 7, the arrangement according to the invention can be implemented as a programmable logic circuit. As provided in accordance with claim 7, it can also advantageously be provided outside the integrated circuit as a link to a simple test system. In this case, the test system controls the arrangement according to the invention and supplies the required clock signals, for example.

The above-named object is achieved by a method for testing integrated circuits by means of the features of claim 10.

BRIEF DESCRIPTION OF THE DRAWINGS

An exemplary embodiment of the invention is explained below in more detail with the aid of the drawing, in which.

DETAILED DESCRIPTION OF THE INVENTION

Figure 1:
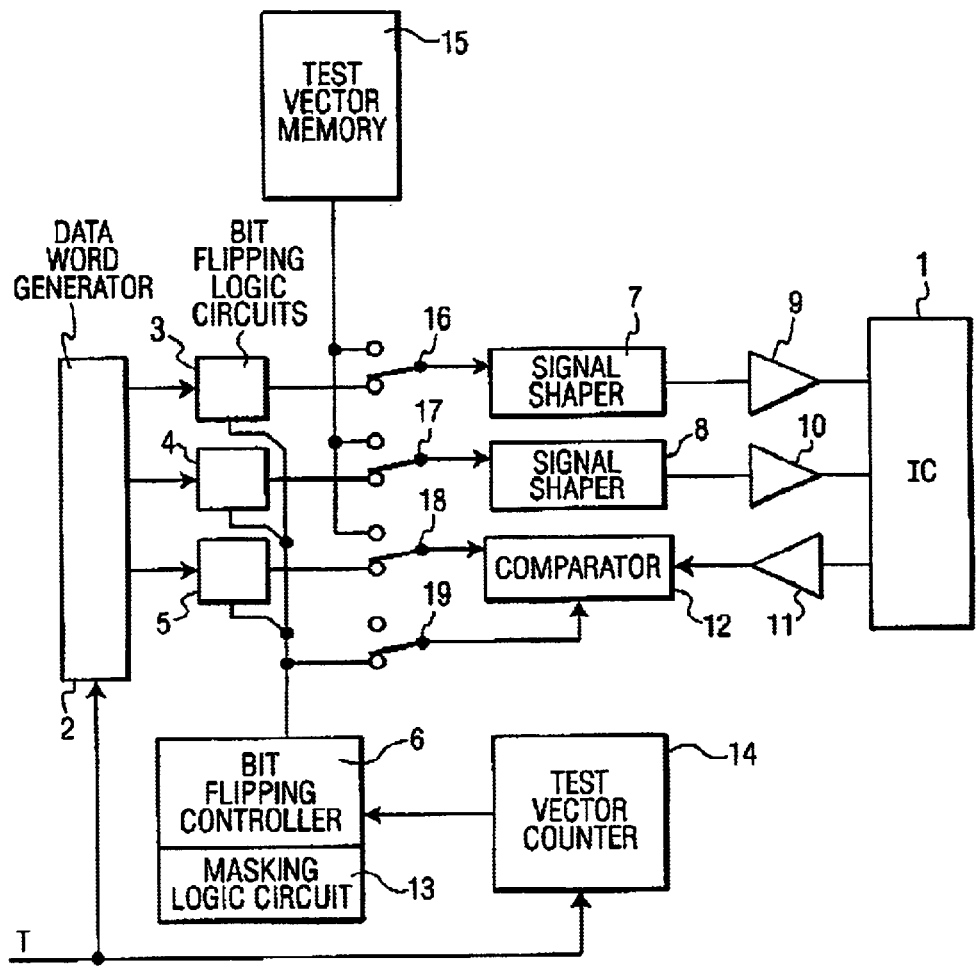
FIG. 1 shows a block diagram of an arrangement according to the invention.

FIG. 1 shows a block diagram of the arrangement according to the invention for testing an integrated circuit 1.

The arrangement has a data word generator 2 which is designed as a feedback shift register. The data word generator 2 is driven by a clock signal T by means of which the test operation is controlled. With each new edge of the clock signal T, the data word generator supplies a new deterministic data word. In this context, deterministic refers to a known sequence of data words such that, therefore, it is known for each pulse of the clock signal T what the data word respectively supplied by the data word generator 2 looks like.

The data words thus generated by data word generator 2 are not yet suitable themselves as test vectors, since the test vectors are to have specific bit values which deviate from the those of the data words.

Consequently, means are provided for test pattern generation which use the deterministic data words supplied by the data word generator 2 to generate prescribed, deterministic test patterns and desired output patterns.

The means for test pattern generation have what are termed bit flipping logic circuits 3, 4 and 5, to which the respective bits of a data word are fed on the input side. In the exemplary embodiment in accordance with FIG. 3, for reasons of clarity the data words provided as test patterns consist of only in each case 2 bits, and the data words provided as desired output patterns consist of in each case 1 bit.

The bit flipping logic circuits 3, 4 and 5 are driven by means of a bit flipping controller 6, which likewise belongs to the means for test pattern generation. In this case, the bit flipping controller 6 controls for each new data word, which is supplied by the data word generator 2 as a function of the clock signal T and whose bits are modified individually such that the desired bits of the respective data words and desired output patterns are produced at the output of the bit flipping logic circuits 3, 4 and 5, and are thereby deterministic.

In this case, the bit flipping logic circuits 3, 4 and 5 are to supply a data word which is fed to the inputs of the IC to be tested. Furthermore, for each test step they supply a data word as desired output pattern, which is compared with the output signal of the IC 1 to be tested.

In the exemplary embodiment in accordance with FIG. 1, for the sake of simplicity that data word which is coupled to the inputs of the IC 1 to be tested consists only of 2 bits. For the sake of simplicity, the desired output test pattern likewise to be generated by the means for test pattern generation consist only of one bit.

In the exemplary embodiment in accordance with FIG. 1, the two bit flipping logic circuits 3 and 4 generate the two bits of one data word each, which is coupled to the inputs of the IC 1 to be tested. By contrast, the bit flipping logic circuit 5 generates the single bit of one desired output pattern each.

The data words supplied by the two bit flipping logic circuits 3 and 4 are coupled via signal shapers 7 and 8 and driver stages 9 and 10 to inputs of the integrated circuit 1 to be tested.

With each test step, and thus with each new data word, that is coupled by means of the drivers 9 and 10 to the inputs of the integrated circuit 1 to be tested, the integrated circuit 1 supplies on the output side an output pattern which passes via a driver stage 11 to a comparator 12. The comparator 12 is a component of comparison means which serve to compare the test output patterns of the integrated circuit to be tested with desired output patterns.

As already explained above, in the exemplary embodiment in accordance with FIG. 1 the desired output patterns are generated by the bit flipping logic circuit 5. Only 1 bit is involved for each desired output pattern in this exemplary embodiment.

Thus, for each test step the comparator 12 compares the test output pattern of the integrated circuit 1 to be tested with the respective desired output pattern, which originates from the bit flipping logic circuit 5. Consequently, the output response of the integrated circuit can be checked for each test step and for each new test pattern or test data word fed to the integrated circuit 1.

The evaluation of the results supplied by the comparator 12 is undertaken in the figure way not shown in more detail, for example, by means of a simple test system.

If appropriate, the integrated circuit 1 or individual elements of this circuit can exhibit an undefined response which results in the fact that not all the output signals of the integrated circuit 1 are to be evaluated. In particular, it can be sensible to suppress the output signals in individual test steps.

Provided in addition for this purpose is a masking logic circuit 13 which drives the comparator 12 such that a comparison does not take place in specific test phases, or that the resultant comparison is not passed on for evaluation.

As already explained above, the test sequence for the integrated circuit 1 is controlled by the clock signal T. With each pulse of this clock signal T, the data word generator 2 supplies a new deterministic data word to the bit flipping logic circuits 3, 4 and 5. Although deterministic data words are involved, it must nevertheless be known at any time which data word is concerned, so that its value is known. In order to ensure this, a test vector counter 14 is provided which counts the clock signal T and supplies the counting result to the bit flipping controller 6 and the masking logic circuit 13. The test phase in which the test operation is located is thereby known at any time to these components. Thus, for each new pulse of the clock signal T the bit flipping controller 6 can use the fact that the data word supplied by the data word generator 2 is known to drive the bit flipping logic circuits 3, 4 and 5 such that the supply on the output side the desired deterministic data words or desired output patterns.

Owing to this arrangement according to the invention, the integrated circuit 1 can be tested without the need for special circuit elements for the purpose, or even on-board test systems on the circuit.

Again, owing to the arrangement according to the invention, it is possible in principle to eliminate a test vector memory in which, otherwise, according to the prior art all the bits of each test vector or test data word are individually stored.

For the purpose of providing flexibility, for example, in order when testing to make use of new test vectors not provided, it is possible, in addition, to provide a test vector memory 15 which can be switched by means of electronic switches 16, 17, 18 and 19, instead of the outputs of the bit flipping logic circuits 3, 4 and 5, to the signal shapers 7 and 8 or to the comparator 12. Again, it is established in each test step by means of the data stored in the test vector memory 15 whether the comparator 12 is to undertake a comparison of a desired output pattern with the output test pattern actually supplied by the integrated circuit 1. Provided for this purpose is the electronic switch 19 by means of which the drive of the comparator 12 can be switched either to a test vector memory 15 or to the bit flipping controller 6.

However, it is to be stated explicitly that the test vector memory 15 is provided only as an option, and is not necessary for the functioning of the arrangement according to the invention.

Rather, the mode of operation of the latter consists in using the bit flipping controller 6 and the bit flipping logic circuits 3 and 4 to configure deterministic data words supplied by the data word generator 2 such that test patterns of prescribed deterministic values are fed to the integrated circuit 1 to be tested. The output test patterns supplied on the output side by the integrated circuit 1 to be tested are compared with desired test patterns which are compared with desired output patterns which are supplied by the bit flipping logic circuit 5. These desired output patterns are also obtained from deterministic data words of the data word generator 2 by means of the bit flipping logic circuit 5 and the bit flipping controller 6.

Figure 2:
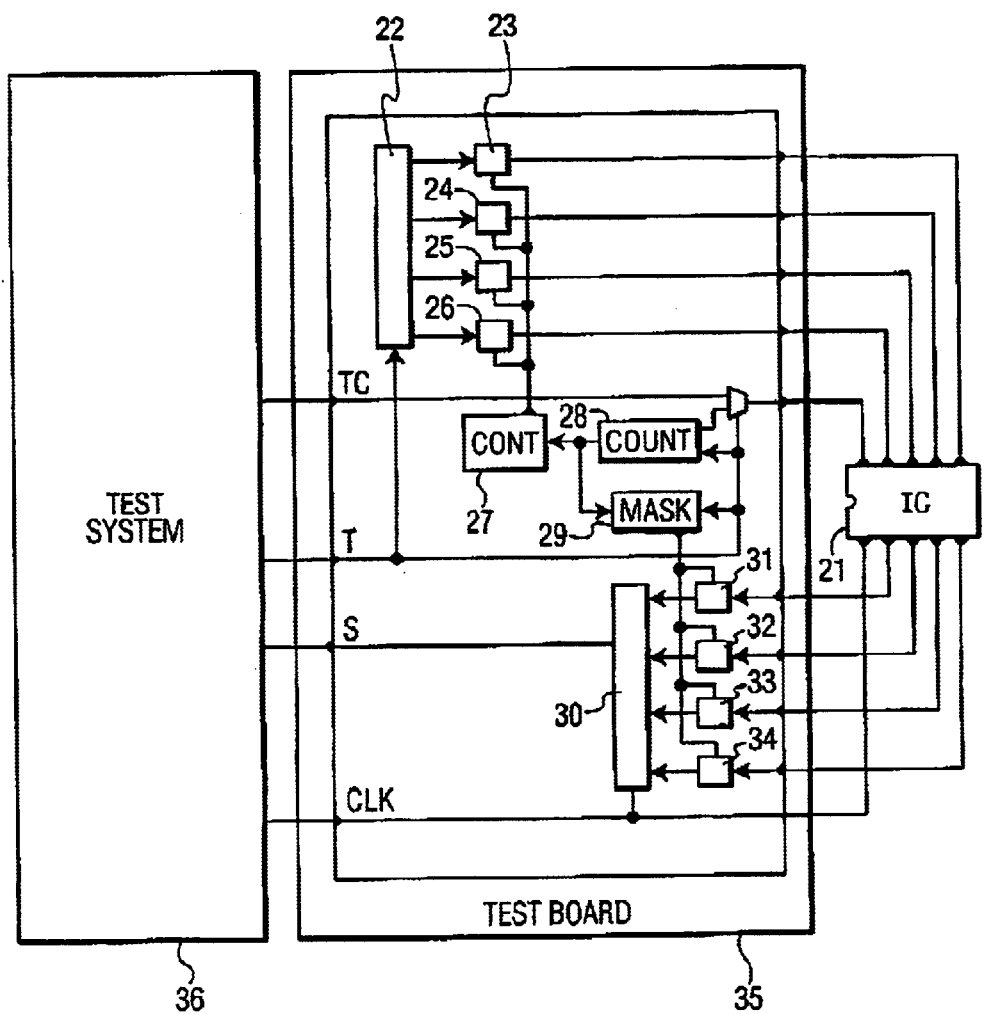
FIG. 2 shows a detailed block diagram of the arrangement according to the invention on a test board which is connected between an IC to be tested and a test system.

Illustrated in FIG. 2 is an arrangement according to the invention for testing an integrated circuit 1 which is slightly modified by comparison with that in accordance with FIG. 1. In particular, the comparison means are of different design in the exemplary embodiment in accordance with FIG. 2.

FIG. 2 shows the arrangement according to the invention for testing the integrated circuit 21 on a test board 35 which is connected between the integrated circuit 21 to be tested and a simple test system 36. The test system 36 serves in this case chiefly to generate specific clock signals, which will be examined later, and to evaluate the results of comparison.

The arrangement according to the invention constructed on the test board 35 can be implemented, in particular, as a programmable logic circuit.

The arrangement according to the invention in accordance with FIG. 2 has a test vector generator 22 downstream of which bit flipping logic circuits 23, 24, 25 and 26 are connected. In this case, the bit flipping logic circuits 23 to 26 serve the purpose of generating with each clock step a 4-bit-wide test pattern which is fed to 4 inputs of the integrated circuit 21 to be tested.

As already explained in conjunction with the exemplary embodiment in accordance with FIG. 1, in this exemplary embodiment in accordance with FIG. 2, as well, the bit flipping logic circuits 23 to 26 are driven by means of a bit flipping controller 27.

Also provided in the exemplary embodiment in accordance with FIG. 2 is a test vector counter 28 which drives the bit flipping controller 27. Provided furthermore is a masking logic circuit 29 which is likewise driven by the test vector counter 28.

A test control input of the integrated circuit 1 to be tested is driven by a control signal which is yielded by and logic operation by means of an AND gate from a signal TC, supplied by the test system 36, and a signal supplied by the test vector counter 28. The integrated circuit 21 to be tested is controlled in this way such that it in each case takes over new test patterns at desired instants.

In the exemplary embodiment in accordance with FIG. 2, the desired output patterns are not generated by means of a data word generator and bit flipping logic circuits but, by means of a signature register 30, a compression of all the output test patterns read out in a stepwise fashion in a test operation, of the integrated circuit 21 to be tested, is logically combined with one another and finally evaluated by the test system 36, a comparison with a desired output pattern being undertaken. In this case, an exclusive-or logic combination with the data word already buffered in the signature register 30 is undertaken in each test step for each new data word. This operation is repeated for each new test pattern step. At the end of a test operation, the signature result is supplied to the test system 36, which evaluates this result. The signature register 30 is clocked by means of a clock signal CLK on the output side just as is the integrated circuit 21 to be tested.

Just as in exemplary embodiment in accordance with FIG. 1, in this procedure it can happen that, because of an undefined response of components in the integrated circuit 21 to be tested, in specific test phases specific outputs of the integrated circuit supply signals which cannot be evaluated, since they assume random values.

In the exemplary embodiment in accordance with FIG. 2, bit modification logic circuits 31, 32, 33 and 34 are therefore provided with the aid of which such bits, which can normally not be evaluated, are modified to produce specific desired values. This is required so that defined states are present for each test step at the inputs of the signature register 30, since a logical combination of all the test patterns which are fed to the signature register 30 is possible over all test steps, or supplies defined results, only in this way.

It may be stated in summary that in the exemplary embodiment in accordance with FIG. 1, the data word generator and the means for test pattern generation, that is to say in particular the bit flipping logic circuits and the bit flipping controller, serve the purpose both of generating test patterns which are fed on the input side to the integrated circuit to be tested, and of generating desired output patterns which are compared with actual output patterns of the integrated circuit during testing.

By contrast therewith, in the exemplary embodiment in accordance with FIG. 2, the data word generator 22 and the means for generating test patterns are used exclusively for the purpose of generating input test patterns for the object to be tested. The output test patterns are logically combined with one another in the second exemplary embodiment in accordance with FIG. 2 via a signature register such that at the end of a test operation the signature register supplies a signature result which now represents only one data word, and is compared with a desired data word that is, for example, permanently stored in the test system.

It holds for both exemplary embodiments of the invention that it is possible to test with the aid of a multiplicity of test vectors without providing voluminous test vector memories. Again, in both cases the integrated circuits to be tested need not include on-board test systems. Furthermore, there is no need to modify the circuits to be tested on the integrated circuit.

What is claimed is:

1. An arrangement for testing an integrated circuit, the arrangement comprising a data word generator which supplies deterministic data words, means for test pattern generation, which modify the deterministic data words such that prescribed, deterministic test patterns which can be fed to inputs of the integrated circuit to be tested, are produced, comparison means for comparing test output patterns of the integrated circuit with at least one desired output pattern, the arrangement being provided outside the integrated circuit to be tested, and having a signature register which logically intercombines consecutive test output patterns, and whose final combination result is compared with a desired output pattern.

2. An arrangement for testing an integrated circuit, the arrangement comprising a data word generator which supplies deterministic data words, means for test pattern generation having one or more bit flipping logic circuits and at least one bit flipping controller to modify the deterministic data words such that prescribed, deterministic test patterns which can be fed to inputs of the integrated circuit to be tested, are produced, and having comparison means for comparing test output patterns of the integrated circuit with at least one desired output pattern, the arrangement being provided outside the integrated circuit to be tested.

3. The arrangement as claimed in claim 2, wherein a feedback shift register is provided as the data word generator.

4. The arrangement as claimed in claim 2, wherein there is provided a masking logic circuit arranged so that the comparison means exclusively compare prescribed test output patterns of the integrated circuit to be tested with the desired output patterns.

5. The arrangement as claimed in claim 2, wherein the at least one bit flipping controller controls and/or drives the bit flipping logic circuits such that the deterministic data words are modified in a bitwise fashion such that the prescribed, deterministic test patterns are produced.

6. The arrangement as claimed in claim 5, wherein a test pattern counter is provided which counts a clock signal and supplies the counting result to the bit flipping controller and/or a masking logic circuit.

7. The arrangement as claimed in claim 2, wherein the desired output pattern is generated by means of the data word generator and the means for test pattern generation.

8. The arrangement as claimed in claim 2, wherein the arrangement is implemented as a programmable logic circuit.

9. The arrangement as claimed in claim 2, wherein the arrangement is provided on a test board which is connected between a test system and the integrated circuit to be tested.

10. A method for testing an integrated circuit, in which method deterministic data words are modified via bit flipping logic circuits and at least one bit flipping controller so that prescribed, deterministic test patterns are produced which can be fed to inputs of the integrated circuit to be tested, test output patterns of the integrated circuit to be tested being compared with at least one desired output pattern, and the method being carried out outside the integrated circuit to be tested.

* * * * *